US008386991B2

(12) United States Patent
Ogata et al.

(10) Patent No.: US 8,386,991 B2
(45) Date of Patent: Feb. 26, 2013

(54) SUPPORT APPARATUS, METHOD, AND RECORDING MEDIUM

(75) Inventors: Katsuya Ogata, Yokohama (JP); Hiroyuki Rokugawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 50 days.

(21) Appl. No.: 12/975,988

(22) Filed: Dec. 22, 2010

(65) Prior Publication Data

US 2011/0161910 A1    Jun. 30, 2011

(30) Foreign Application Priority Data

Dec. 24, 2009  (JP) ................................. 2009-292511

(51) Int. Cl.
*G06F 17/50*  (2006.01)
(52) U.S. Cl. ......... 716/136; 716/100; 716/110; 716/122
(58) Field of Classification Search ................ 716/100, 716/110–112, 136, 118–119, 122; 703/13–14
See application file for complete search history.

(56) References Cited

U.S. PATENT DOCUMENTS

| 7,093,215 | B2 | | 8/2006 | Sahara et al. | |
|---|---|---|---|---|---|
| 7,480,604 | B2 | * | 1/2009 | Bianchi | 703/14 |
| 7,761,278 | B2 | * | 7/2010 | Chidambarrao et al. | 703/14 |
| 7,934,178 | B2 | * | 4/2011 | Arimoto | 716/100 |
| 7,996,202 | B2 | * | 8/2011 | Bianchi | 703/14 |
| 8,112,729 | B2 | * | 2/2012 | Tonti et al. | 716/110 |
| 8,136,079 | B2 | * | 3/2012 | Agarwal et al. | 716/132 |
| 8,151,240 | B2 | * | 4/2012 | Agarwal et al. | 716/136 |
| 2004/0059559 | A1 | * | 3/2004 | Shimizu et al. | 703/14 |
| 2006/0259881 | A1 | | 11/2006 | Sahara et al. | |
| 2007/0028195 | A1 | * | 2/2007 | Chidambarrao et al. | 716/2 |
| 2008/0021689 | A1 | * | 1/2008 | Yamashita et al. | 703/14 |
| 2008/0077378 | A1 | * | 3/2008 | Ikoma et al. | 703/14 |
| 2008/0127005 | A1 | * | 5/2008 | Lin et al. | 716/4 |
| 2009/0024974 | A1 | * | 1/2009 | Yamada | 716/6 |
| 2009/0055152 | A1 | * | 2/2009 | Bianchi | 703/14 |
| 2009/0288049 | A1 | * | 11/2009 | Moroz et al. | 716/4 |
| 2009/0299716 | A1 | * | 12/2009 | Liu et al. | 703/13 |
| 2010/0023899 | A1 | * | 1/2010 | Moroz et al. | 716/4 |
| 2010/0023900 | A1 | * | 1/2010 | Moroz et al. | 716/4 |
| 2010/0023901 | A1 | * | 1/2010 | Moroz et al. | 716/4 |
| 2010/0023902 | A1 | * | 1/2010 | Moroz et al. | 716/4 |
| 2010/0042958 | A1 | * | 2/2010 | Moroz et al. | 716/4 |
| 2010/0257493 | A1 | * | 10/2010 | Agarwal et al. | 716/4 |
| 2011/0204384 | A1 | * | 8/2011 | Cheng et al. | 257/77 |

FOREIGN PATENT DOCUMENTS

| JP | 2003-264242 A | 9/2003 |
|---|---|---|
| JP | 2004-241529 A | 8/2004 |
| JP | 2007-123442 A | 5/2007 |

OTHER PUBLICATIONS

Dunga, Mohan V. et al.,"BSIM4.6.0 MOSFET Model—User's Manual", 2006, pp. 1-201.

* cited by examiner

*Primary Examiner* — Stacy Whitmore
(74) *Attorney, Agent, or Firm* — Fujitsu Patent Center

(57) ABSTRACT

A design support apparatus includes: a circuit-data generation unit to generate circuit data based on layout information of a semiconductor integrated circuit; and a parameter determination unit to set a first parameter relating to mechanical stress exerted on a transistor including at least one of a plurality of gates in a diffusion region, wherein the circuit-data generation unit obtains a mobility of the transistor based on the first parameter and reflects the mobility in the circuit data.

6 Claims, 7 Drawing Sheets

FIG. 4

| S1 (AND/OR S2)[um] | SD[um] | NGY | SA (AND/OR SB)[um] |
|---|---|---|---|
| 0.1-0.2 | 0.1-0.2 | 1-20 | 1 |
| | | 20-100 | |
| | | >100 | |
| | 0.2-0.3 | 1-20 | 2 |
| | | 20-100 | |
| | | >100 | |
| | >0.3 | 1-20 | 3 |
| | | 20-100 | |
| | | >100 | |

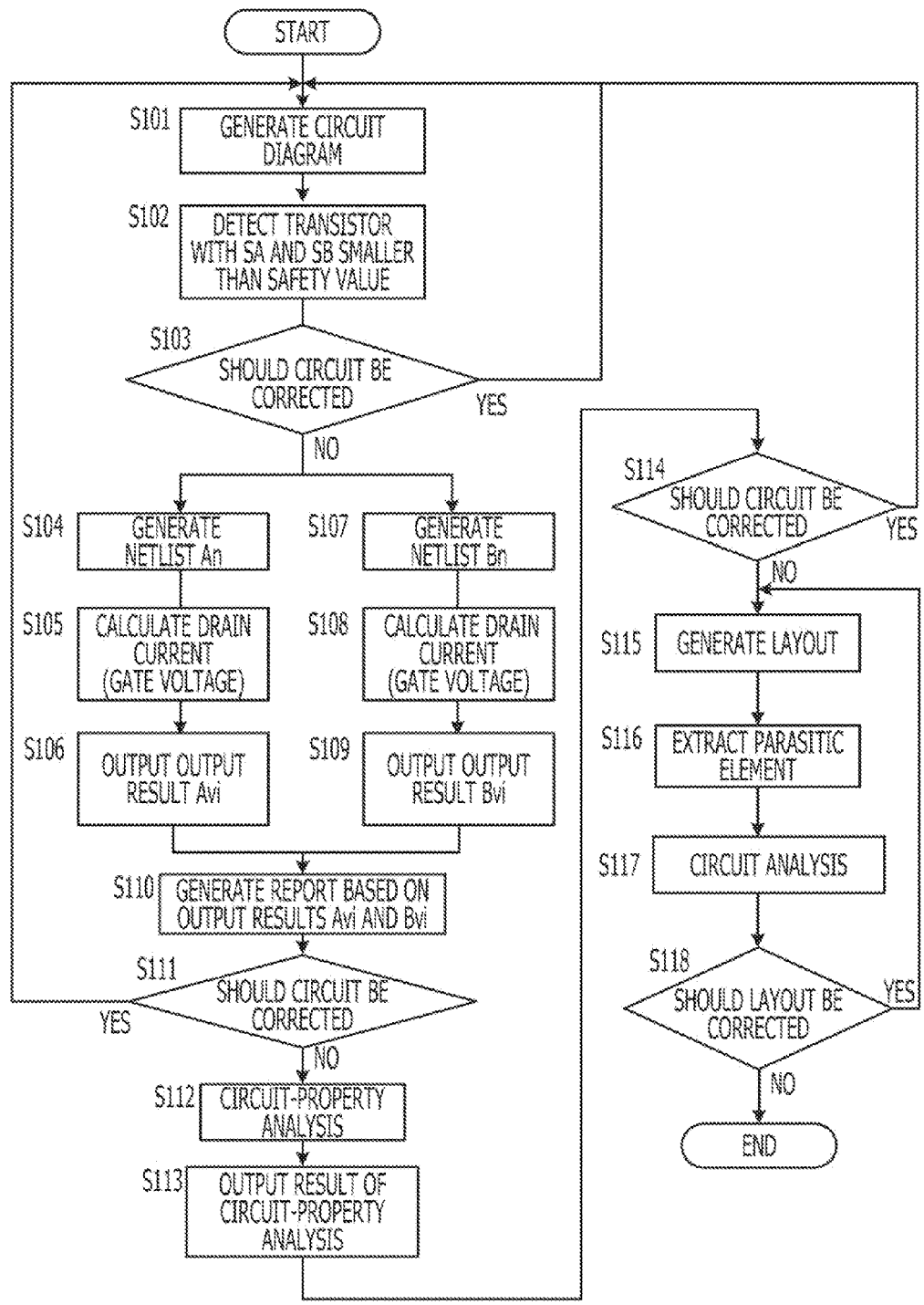

SUPPORT APPARATUS, METHOD, AND RECORDING MEDIUM

CROSS-REFERENCE TO RELATED APPLICATIONS

This application claims the benefit of priority from Japanese Patent Application No. 2009-292511 filed on Dec. 24, 2009, the entire contents of which are incorporated herein by reference.

1. FIELD

Embodiments discussed herein relate to a design support apparatus, method, and recording medium.

2. DESCRIPTION OF RELATED ART

During a large-scale integrated (LSI) design, a circuit design is performed in an upstream process and a layout design is performed for data obtained through the circuit design. During the circuit design, the register transfer level (RTL) design is performed based on the specifications of the LSI design, and gate-level circuit data such as a netlist is generated based on design data described in the RTL description. Since a simulation is performed based on the netlist, a circuit element including a transistor, a resistance element, a capacity element, and so forth may be modeled at the netlist-generation time.

Transistor models are proposed to simulate the complicated physical characteristic of a transistor. In the transistor, for example, the mobility may vary due to a mechanical stress (hereinafter referred to as a shallow trench isolation (STI) stress) exerted from an element isolating-insulation film on the transistor. The BSIM4, which is a transistor model that had been proposed by University of California, Berkeley, illustrates the mechanical-stress dependence of the mobility as a function of the distance from an end of the element isolating-insulation film to the center of a channel.

Related art is disclosed in Japanese Laid-open Patent Publication No. 2003-264242, Japanese Laid-open Patent Publication No. 2007-123442, Japanese Laid-open Patent Publication No. 2004-241529, Non-patent Document "BSIM4.6.0 MOSFET Model User's Manual", and so forth.

SUMMARY

According to one aspect of the embodiments, a design support apparatus includes: a circuit-data generation unit to generate circuit data based on layout information of a semiconductor integrated circuit; and a parameter determination unit to set a first parameter relating to a mechanical stress exerted on a transistor including at least one of a plurality of gates in a diffusion region, wherein the circuit-data generation unit obtains a mobility of the transistor based on the first parameter and reflects the mobility in the circuit data.

The object and advantages of the invention will be realized and attained at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 4 illustrates exemplary map data.
FIG. 7 illustrates an exemplary design flow.

DESCRIPTION OF EMBODIMENTS

Figure 1:
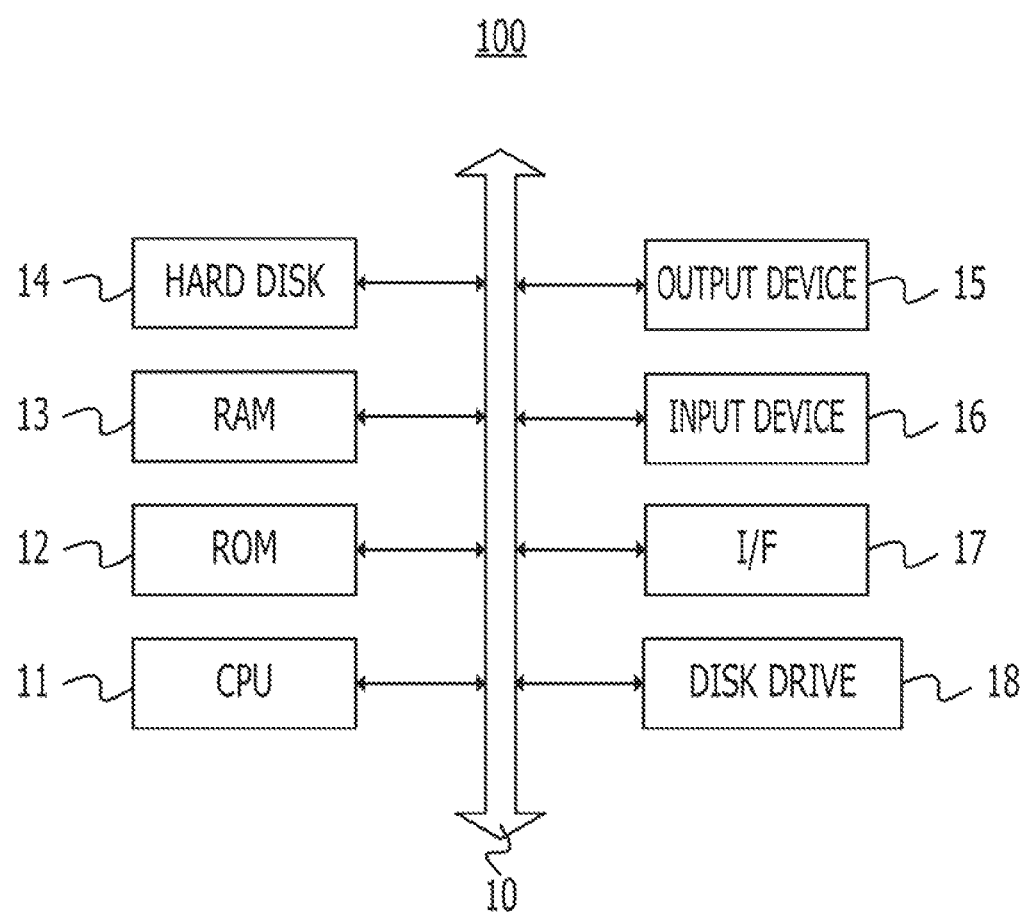
FIG. 1 illustrates an exemplary design support apparatus.

FIG. 1 illustrates an exemplary design support apparatus. A design support apparatus 100 includes, for example, a process design kit (PDK), generates a netlist through a design circuit, and models a circuit element including a transistor, a resistance element, a capacity element, and so forth. The design support apparatus 100, which may be a personal computer (PC) or the like, includes a central processing unit (CPU) 11, a read only memory (ROM) 12, a random access memory (RAM) 13, and a hard disk 14. The design support apparatus 100 further includes an output device 15, an input device 16, an interface 17, and a disk drive 18. The above-described elements are coupled to a bus 10. The output device 15 may include, for example, a monitor, a printer, and so forth. The input device 16 may include, for example, a mouse, a keyboard, and so forth. The interface 17 may include, for example, an external connection interface such as a universal serial bus (USB). The disk drive 18 may include, for example, a disk drive provided to drive a disk such as a digital versatile disc (DVD).

A circuit is generated by a circuit generation editor or the like. Information about the layout of a circuit element is supplied to the design support apparatus 100. According to the design support apparatus 100, a circuit element in the circuit is modeled based on the layout information. When generating the netlist based on the circuit, the design support apparatus 100 reflects information about the physical characteristic of the modeled circuit element into the netlist. For example, in the design support apparatus 100, the CPU 11 executes a program stored in the ROM 12 or the like so that a circuit element is modeled or a netlist reflecting the physical characteristic of the modeled circuit element is generated.

Figure 2:
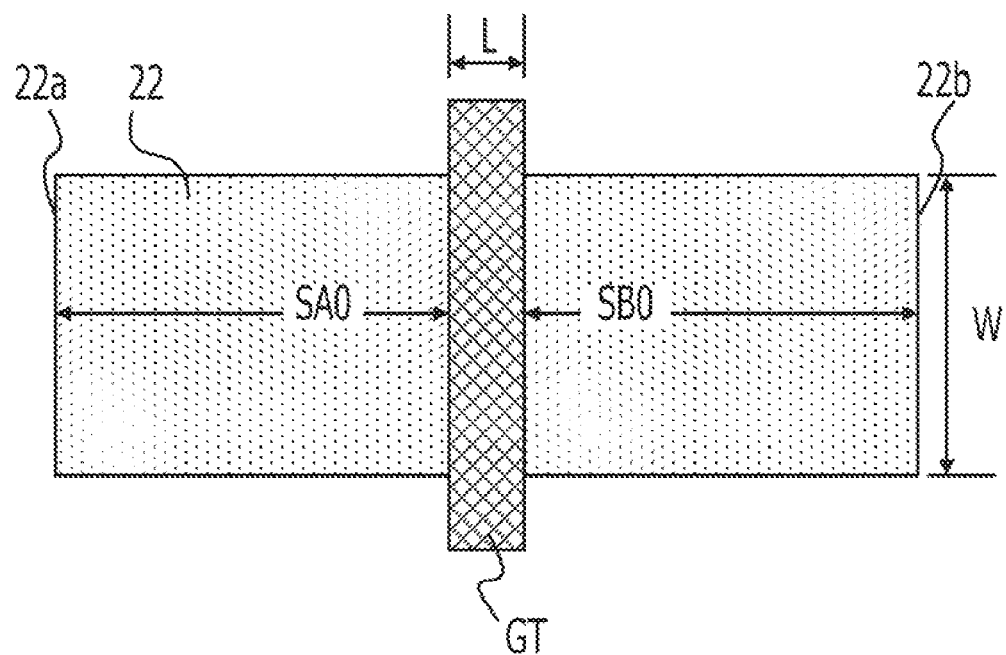
FIG. 2 illustrates an exemplarily modeled transistor.
Figure 3:
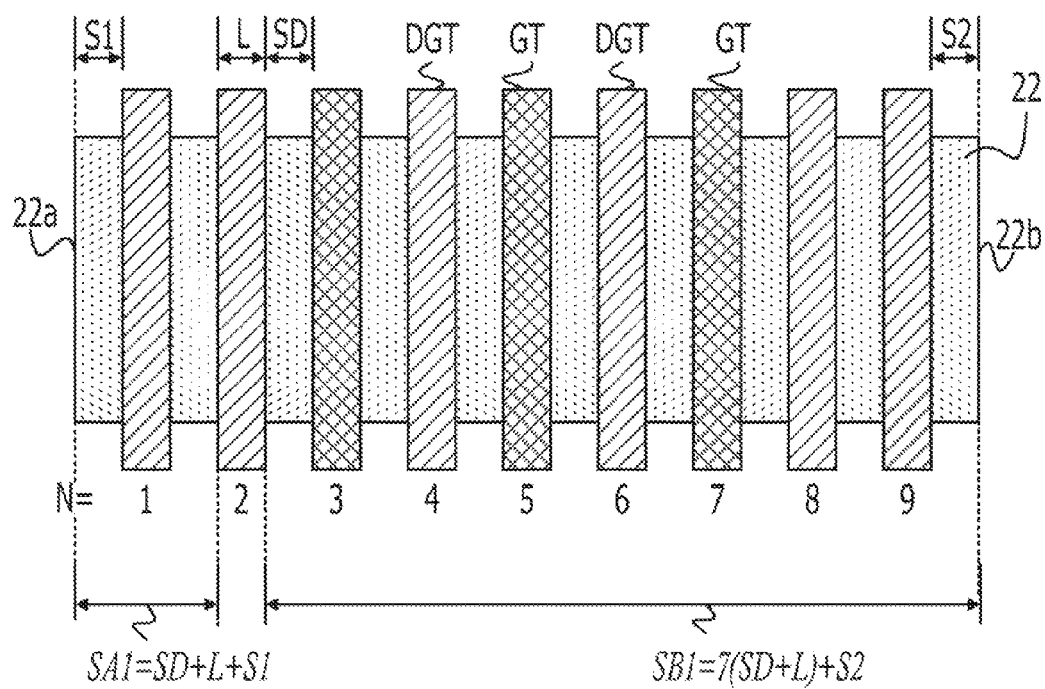
FIG. 3 illustrates an exemplarily modeled transistor.

FIGS. 2 and 3 illustrate an exemplarily modeled transistor. The modeled transistor illustrated in FIGS. 2 and 3 may be a metal-oxide-semiconductor field-effect transistor (MOSFET).

In FIG. 2, a single rectangular gate electrode GT is provided within a diffusion region 22. An element isolating-insulation film (not shown) is provided outside each of ends 22a and 22b of the diffusion region 22. The gate electrode GT is arranged so that the long side of the gate electrode GT cuts across the diffusion region 22. The width of the diffusion region 22 may be W. A length of the gate electrode GT along the direction of the short side of the gate electrode GT may be L. The gate length and the gate width of the transistor illustrated in FIG. 2 may be respectively L and W. As indicated by Equation (1) illustrated below, for example, a drain current Id of the transistor is proportionate to the product of mobility u0, an oxide-film thickness Cox of the gate electrode GT, and the gate length L/the gate width W.

$$Id \propto u0 \cdot Cox \cdot \frac{L}{W} \qquad (1)$$

When each of the oxide-film thickness Cox and the mobility u0 is set to a constant, the value of the drain current Id is estimated by modeling the gate length L and the gate width W.

The mobility u0 may vary due to the STI stress exerted from the element isolating-insulating film. Therefore, when the mobility u0 is set to a constant, an error may occur during the circuit analysis in the layout design. For example, the error between a drain current estimated during the circuit design and that estimated during the layout design may occur.

The BSIM4 proposes a model for estimating variations in the mobility due to the STI stress. For example, when the distances from the ends of the diffusion region to the gate electrode are the parameters SA and SB respectively, a relative variation $\rho_{ueff}$ in the mobility is obtained through the following equations (2) and (3).

$$\begin{cases} \text{Inv\_sa} = \dfrac{1}{SA + 0.5 \cdot Ld} \\ \text{Inv\_sb} = \dfrac{1}{SB + 0.5 \cdot Ld} \end{cases} \quad (2)$$

$$\rho_{ueff} = \dfrac{KU0}{\text{Kstress\_u0}} \cdot (\text{Inv\_sa} + \text{Inv\_sb}) \quad (3)$$

In Equation (2), the sign Ld indicates the channel length. In Equation (3), each of the signs KU0 and Kstress_u0 is a constant. In FIG. 2, a distance SA0 from one of an end 22a of the diffusion region 22 to the gate electrode GT may substitute for the parameter SA illustrated in Equation (2) and a distance SB0 from an end 22b of the diffusion region 22 to the gate electrode GT may substitute for the parameter SB illustrated in Equation (2), for example.

The relative variation $\rho_{ueff}$ in the mobility depends on the parameters SA and SB. For example, in FIG. 2, the relative variation $\rho_{ueff}$ depends on each of the distances SA0 and SB0 from the respective end of the diffusion region 22 to the gate electrode GT. According to the design support apparatus 100, for example, the relative variation $\rho_{ueff}$ is calculated using the model proposed by the BSIM based on information about the distances SA0 and SB0 supplied as the layout information. According to the design support apparatus 100, the mobility reflecting the influence of the STI stress is obtained and the value of a drain current reflecting the influence of the STI stress is calculated.

As illustrated in FIG. 3, a plurality of gates may be arranged on the same diffusion region 22, for example. In FIG. 3, nine gates including dummy gates DGT are arranged within the diffusion region 22 in parallel. Each of gates illustrated as N=3, 5, and 7 may correspond to the gate electrode GT and each of gates illustrated as N=1, 2, 4, 6, 8, and 9 may correspond to the dummy gate DGT. The distances from the ends 22a and 22b of the diffusion region 22 to the gate electrodes GT are calculated. The mobility variations in a transistor including the gate electrodes GT may be estimated based on the distances.

The design support apparatus 100 models a transistor by determining the parameters SA and SB corresponding to a transistor including the gate electrodes GT of the same diffusion region 22 based on the gate-layout form.

For example, the average value of distances from the ends of the diffusion region 22 to the gates including the dummy gates DGT may correspond to the parameters SA and SB of each of to the gate electrodes GT.

When a distance between the closest gate to the end 22a and the end 22a, for example, a distance between the gate indicated as N=1 and the end 22a is set to S1, the gate length is set to L, and the gate pitch is set to SD, a distance SA1 from the end 22a to each of the gates is obtained through the following Equation (4).

$$SA1 = (N-1)(SD+L)+S1 \quad (4)$$

When the number of the gates that are provided within the diffusion region 22 is set to NGY, and the distance between the closest gate to the other end 22b of the diffusion region 22, such as a gate indicated as N=9, and the end 22b is set to S2, a distance SB1 from the end 22b to each of the gates is obtained through the following Equation (5).

$$SB1 = (NGY-N)(SD+L)+S2 \quad (5)$$

For example, since the NGY equals to 9, the distances SA1 and SB1 from the respective ends 22a and 22b to the dummy gate indicated as N=2 are calculated through Equations (4) and (5).

$$SA1 = (2-1)(SD+L)+S1 = SD+L+S1 \quad (6)$$

$$SB1 = (9-2)(SD+L)+S2 = 7(SD+L)+S2 \quad (7)$$

The parameters SA and SB are obtained as the average values of the distances SA1 and SB1 as follows.

$$SA = \overline{SA1} = \dfrac{1}{NGY} \sum_{N=1}^{NGY} \{(N-1)(SD+L)+S1\} \quad (8)$$

$$SB = \overline{SB1} = \dfrac{1}{NGY} \sum_{N=1}^{NGY} \{(NGY-N)(SD+L)+S2\} \quad (9)$$

The calculated parameters SA and SB are set to the parameters SA and SB of transistors which include the respective gate electrode within the same diffusion region. For example, in FIG. 3, the parameters SA and SB of each of transistors including the gate electrodes GT that are indicated as N=3, 5, and 7 are set to the average values of the distances SA1 and SB1.

The calculated parameters SA and SB are substituted into the expressions (1) to (3) and the mobility reflecting the influence of the STI stress is calculated for each of the transistors including the gate electrodes GT within the same diffusion region. In FIG. 3, for example, the mobility reflecting the influence of the STI stress is calculated for each of transistors including the gate electrodes GT that are indicated as N=3, 5, and 7.

For example, the parameter SA or the parameter SB may be obtained based on map data indicating the distance S1 or the distance S2, the gate pitch SD, the number NGY of the gates within the diffusion region, and the parameter SA (and/or the parameter SB).

FIG. 4 illustrates exemplary map data. For example, when the distance S1 equals to 0.1 [um], the gate pitch SD equals to 0.2 [um], and the gate number NGY equals to 9 in a diffusion region, the SA=1 [um] may be obtained based on the map data illustrated in FIG. 4. The values in the map data may be an adaptive value obtained in advance through a simulation, an experiment, and so forth. For example, when the distance S2 equals to 0.1 [um], the gate pitch SD equals to 0.2 [um], and the gate number NGY equals to 9, the SB=1 [um] may be obtained based on the map data illustrated in FIG. 4.

The obtained parameters SA and SB are substantially set to the parameters SA and SB of each of transistors including the gate electrodes within the same diffusion region. The obtained parameters are substituted into the expressions (1) to (3), and mobility reflecting the influence of the STI stress is substantially obtained for each of the transistors including the gate electrodes within the same diffusion region.

The parameters SA and SB corresponding to the transistor including the gate electrodes within the same diffusion region may be determined based on the gate-layout form of the diffusion region. The calculation may be simplified as compared to the case where the parameters SA and SB are calculated for each of the transistors including the gate electrodes within the same diffusion region. The parameters SA and SB may be calculated based on the values of S1, S2, NGY, and SA precisely.

In the design support apparatus 100, when the parameters SA and SB that are obtained according to the above-described method are smaller than those when the mobility becomes saturated, the parameters SA and SB when the mobility becomes saturated may be used.

Figure 5:
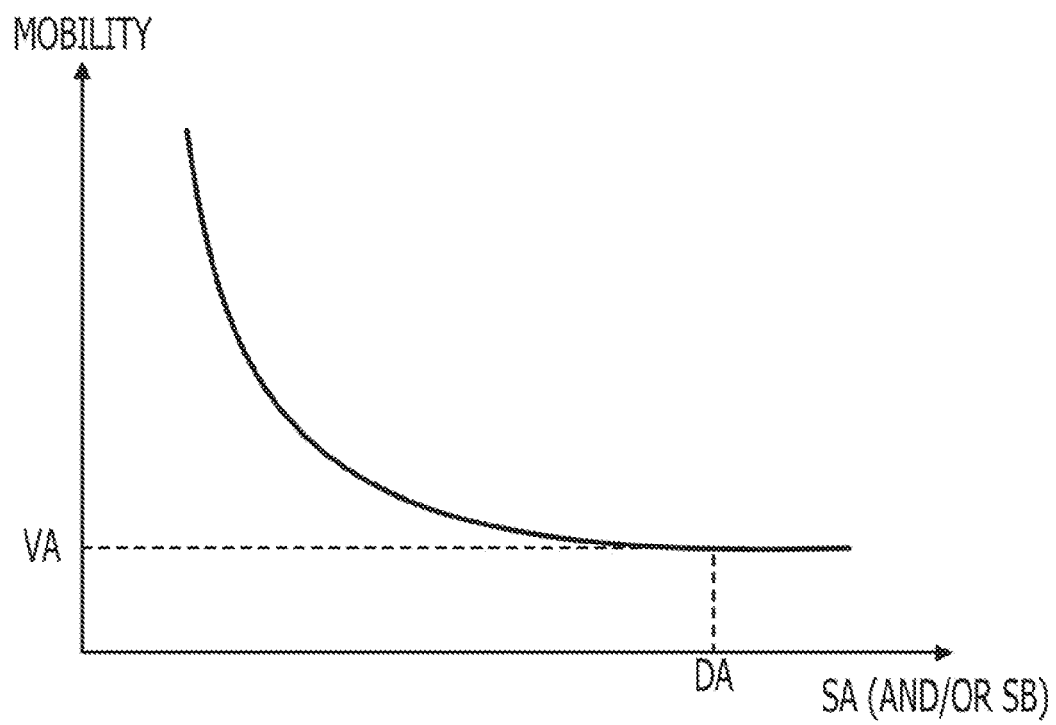
FIG. 5 illustrates an exemplary relationship between mobility and parameters.

FIG. 5 illustrates an exemplary relationship between a mobility and a parameter. The variation amount of the mobility is decreased with an increase in the parameters SA and SB, and the mobility becomes saturated in the end. The value DA of the parameters SA and SB corresponding to a saturation value VA when the mobility becomes saturated may be a safety value. When the value of each of parameters SA and SB is smaller than the safety value, variations in the mobility may occur due to the STI stress.

In the design support apparatus 100, when the value of each of the parameters SA and SB is smaller than the safety value, the safety value DA is set as the parameters SA and SB. The design support apparatus 100 calculates the mobility of each of the transistors and reflects the calculated mobility into the netlist after setting the parameters SA and SB in the circuit to values which are equivalent to or larger than the safety value DA. The variations in the mobility of each of the transistors corresponding to the netlist reflecting the calculated mobility may be decreased and the error of the drain current may not occur.

The gate-layout form of the diffusion region 22 may be corrected so that each of the values of the parameters SA and SB substantially becomes the safety value DA. The distances S1 and S2 from the gates near the ends of the diffusion region to the ends and the gate pitch SD are corrected so that the value of each of the parameters SA and SB substantially becomes the safety value DA. During the circuit design, the layout form of a diffusion region with decreased variations in the mobility may be provided.

Since the values of the parameters SA and SB are set to the values which are equivalent to or larger than the safety value DA, there may be no difference between the drain current estimated during the circuit design and that estimated during the layout design. Consequently, the return from the layout design to the circuit design may be decreased.

A plurality of the gate electrodes GT may be provided with no dummy gates being provided. The gate voltage may be obtained instead of the drain current based on the variations in the mobility.

Figure 6:
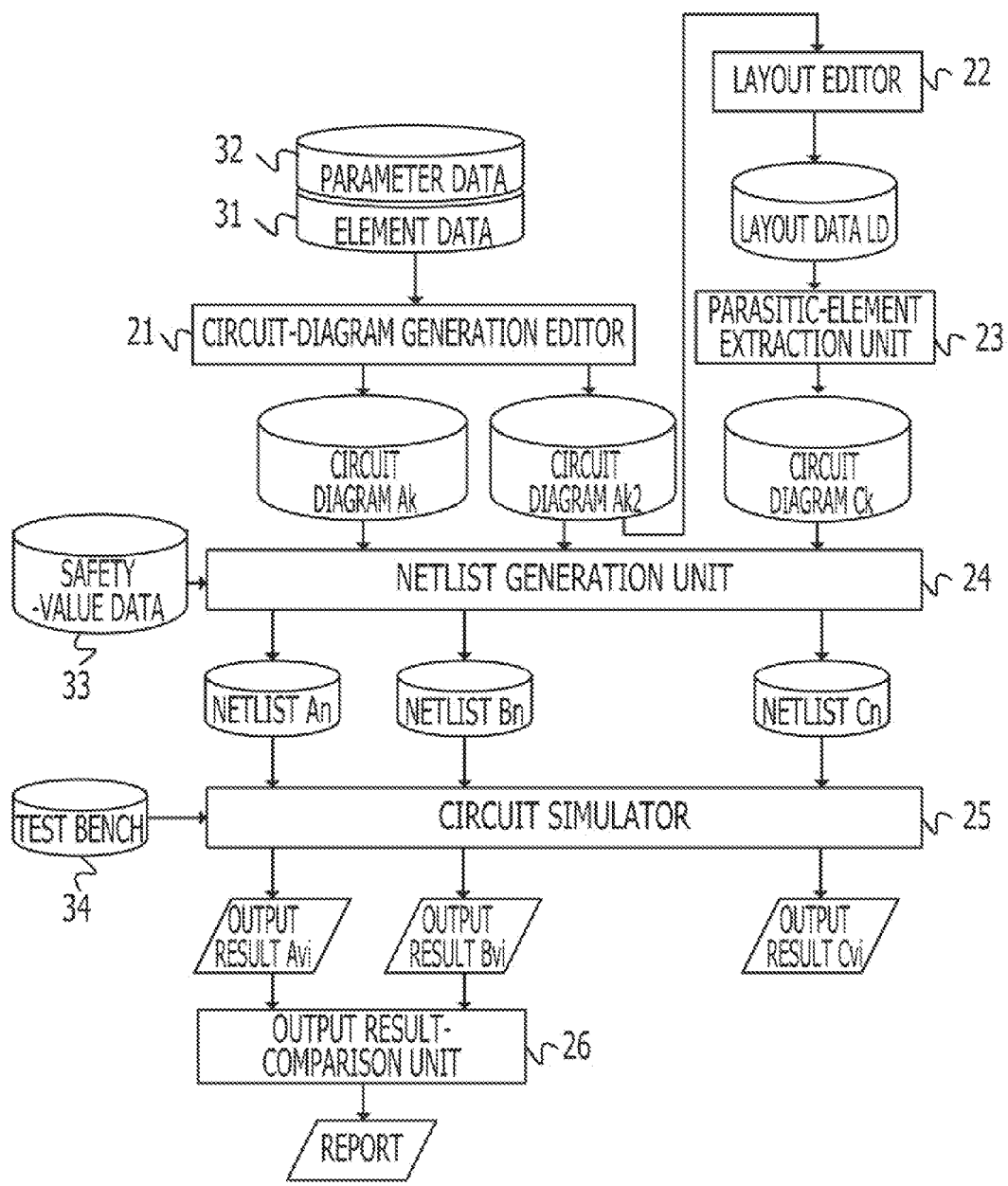
FIG. 6 illustrates an exemplary design support apparatus.

FIG. 6 illustrates an exemplary design support apparatus.

The design support apparatus 100 includes a circuit-diagram generation editor 21, a layout editor 22, a parasitic-element extraction unit 23, a netlist generation unit 24, a circuit simulator 25, and an output-result comparison unit 26. For example, the above-described elements may operate by the CPU 11 executing a program stored in the ROM 12 or the like. The design support apparatus 100 further includes an element-data storage unit 31, a parameter-data storage unit 32, a safety-value data storage unit 33, and a test-bench storage unit 34. The above-described storage units may correspond to the hard disk 14 illustrated in FIG. 1.

The element-data storage unit 31 stores information about the layout of a circuit element including, for example, a transistor, a resistance element, a capacity element, and so forth. The STI-stress information indicating the S1, S2, SD, and so forth, such as the parameter information may be stored in the parameter-data storage unit 32.

During the circuit design, a designer may generate a circuit diagram with the circuit-diagram generation editor 21. For example, the designer generates a circuit diagram Ak with the circuit-diagram generation editor 21. The layout information stored in the element-data storage unit 31 and the parameter information stored in the parameter-data storage unit 32 are associated with each of circuit elements in the circuit. For example, the transistor is associated with the parameter information related to the STI stress, such as S1, S2 or SD of the diffusion region where the transistor is arranged. Information about the circuit diagram Ak is supplied to the netlist generation unit 24.

The netlist generation unit 24 generates a netlist based on a circuit diagram. For example, the netlist generation unit 24 generates two netlists An and Bn based on the circuit diagram Ak. The netlist An may be a netlist generated without consideration of variations in the mobility caused by the STI stress. The netlist Bn may be a netlist generated in consideration of variations in the mobility caused by the STI stress. When generating the netlist Bn, the netlist generation unit 24 may use the above-described modeling method for each of the transistors.

The netlist generation unit 24 obtains the parameters SA and SB based on the parameter information including the distances S1 and S2, the gate pitch SD, and so forth for each of the transistors in the circuit as illustrated in FIGS. 3 and 4. The netlist generation unit 24 sets a safety value as new parameters SA and SB when old parameters SA and SB are smaller than the safety value stored in the safety-value data storage unit 33. The netlist generation unit 24 obtains the mobility based on the parameters SA and SB for each of the transistors in the circuit and generates the netlist Bn reflecting the mobility. Since the parameters SA and SB of each of the transistors are equal to or larger than the safety value, the variations in the mobility of the netlist Bn are decreased. The netlist generation unit 24 may correspond to a circuit-data generation section and a parameter determination section. The parameter SA or the parameter SB which is smaller than the safety value is set as the safety value and the circuit diagram Ak is corrected. For example, the netlist generation unit 24 outputs a list of transistors including the parameter SA or the parameter SB which is smaller than the safety value. For example, the designer may confirm the list and correct the gate-layout form of the diffusion region where the transistor is arranged so that the parameter SA or the parameter SB becomes the safety value. The designer may correct the distances S1 and S2, and the gate pitch SD of the circuit diagram Ak.

The circuit simulator 25 performs the circuit analysis based on a netlist. For example, the circuit simulator 25 outputs the drain current or the gate voltage of a transistor based on the netlist An or the netlist Bn. The circuit simulator 25 outputs an output result Avi including the drain current or the gate voltage of each of the transistors, which is calculated based on the netlist An. The circuit simulator 25 outputs an output result Bvi including the drain current or the gate voltage of each of the transistors, which is calculated based on the netlist Bn. The output results Avi and Bvi are supplied to the output-result comparison unit 26. The circuit simulator 25 performs the circuit-property analysis on netlist data supplied during the circuit design and the layout design using test-bench description data stored in the test-bench storage unit 34. The circuit-property analysis includes, for example, a DC analysis, an AC analysis, a transient analysis, a power-consumption analysis, and so forth. Conditions for performing the circuit-property analysis may be set in the test-bench description data.

The output-result comparison unit 26 outputs the information of a transistor in which the difference between the output results Avi and Bvi including the drain current or the gate voltage is larger than evaluation criteria as report information. The evaluation criteria may be set in advance by the designer, for example.

A transistor provided without consideration of precision is selected among from the reported transistors based on the report information output from the output-result comparison unit 26. A circuit diagram Ak2 is generated by correcting the parameters SA and SB, which have been corrected to the safety value of the selected transistor, to the parameters SA and SB before the correction based on the circuit diagram Ak. The circuit diagram Ak2 is input to the netlist generation unit 24 and the circuit simulator 25 performs the circuit-property analysis including the DC analysis or the like. When the result of the circuit-property analysis is appropriate, the layout design may be performed.

The layout editor 22 may generate layout data during the layout design. The layout editor 22 performs the layout design based on the circuit diagram Ak2 so that layout data LD is generated. The layout data LD is supplied to the parasitic-element extraction unit 23.

The parasitic-element extraction unit 23 extracts information about a parasitic element based on the layout data LD and outputs a circuit diagram Ck associated with the parasitic element. The circuit-diagram Ck is supplied to the netlist generation unit 24 and a netlist Cn reflecting the influence of the parasitic element is generated. The netlist Cn is supplied to the circuit simulator 25. The circuit simulator 25 calculates the drain current or the gate voltage of each of the transistors based on the netlist Cn, outputs an output result Cvi, and performs the circuit-property analysis including the DC analysis.

FIG. 7 illustrates an exemplary design flow. The design flow illustrated in FIG. 7 may be performed by the design support apparatus 100 illustrated in FIG. 1. The mobility of the transistor may be estimated based on the parameters SA and SB, and a correction may be performed to decrease variations in the mobility during the circuit design, and the layout design may be performed.

The circuit diagram Ak is generated during an operation S101. Each of circuit elements in the circuit diagram Ak is associated with the layout information stored in the element-data storage unit 31 or the parameter information stored in the parameter-data storage unit 32. The process proceeds to an operation S102.

During the operation S102, the netlist generation unit 24 obtains the parameters SA and SB of each of the transistors in the circuit diagram Ak, and detects a transistor having parameters SA and SB which are smaller than the safety value. During an operation S103, the process returns to the operation S101 to perform the circuit correction so that each of the parameters SA and SB becomes the safety value for the transistor detected during the operation S102 (operation S103: No). When each of the parameters SA and SB of each of the transistors in the circuit diagram Ak is equivalent to or larger than the safety value, the circuit correction is not performed (operation S103: Yes) and the process proceeds to an operation S104.

The netlist generation unit 24 generates the netlist An during operation S104 and the netlist Bn during operation S107 based on the circuit diagram Ak. The mobility variations caused by the STI stress are not considered in the netlist An and are considered in the netlist Bn. The netlists An and Bn are input to the circuit simulator 25. The circuit simulator 25 performs operations S105 and S106 for the netlist An, and performs operations S108 and S109 for the netlist Bn.

During the operation S105, the circuit simulator 25 obtains the drain current or the gate voltage of each of the transistors based on the netlist An. During the operation S106, the circuit simulator 25 outputs the drain current or the gate voltage as the output result Avi. During the operation S108, the circuit simulator 25 obtains the drain current or the gate voltage of each of the transistors based on the netlist Bn. During the operation S109, the circuit simulator 25 transmits the drain current or the gate voltage as the output result Bvi. Information about the output results Avi and Bvi is supplied to the output-result comparison unit 26 and the process proceeds to an operation 5110.

During the operation 5110, the output-result comparison unit 26 outputs the information of a transistor in which the difference between the output results Avi and Bvi corresponding to the drain current or the gate voltage is larger than the evaluation criteria as report information.

During an operation 5111, the designer determines whether or not the reported transistors include at least one transistor of which precision does not matter. If the reported transistors include the transistor of which precision does not matter, the process returns to the operation S101 to perform the circuit correction in which the safety value is not applied to the parameters SA and SB (operation S111: Yes). The circuit diagram Ak2 may be generated by correcting the circuit diagram Ak. The circuit correction is not performed when the reported transistors include no transistor of which precision does not matter (operation S111: No), and the process proceeds to an operation S112. The circuit simulator 25 performs the circuit-property analysis based on the netlist Bn. The circuit simulator 25 performs the circuit-property analysis such as the DC analysis. During an operation S113, the circuit simulator 25 outputs a result of the circuit-property analysis.

During an operation S114, it is determined whether or not the circuit correction is performed based on the result of the circuit-property analysis. If the circuit correction is performed (operation S114: Yes), the process returns to the operation S101. If the circuit correction is not performed (operation S114: NO), the process proceeds to an operation S115.

During an operation S115, the layout data LD is formed based on a circuit diagram which is generated or corrected in the operations S101 to S114. The layout data LD is supplied to the parasitic-element extraction unit 23.

During an operation S116, the parasitic-element extraction unit 23 extracts the parasitic element based on the layout data LD and outputs the circuit diagram Ck associated with the parasitic element. The netlist generation unit 24 generates the netlist Cn reflecting the influence of the parasitic element based on the circuit diagram Ck. Information about the generated netlist Cn is supplied to the circuit simulator 25.

During an operation S117, the circuit simulator 25 performs the circuit analysis based on the netlist Cn. For example, the circuit simulator 25 calculates the drain current or the gate voltage of each of the transistors and outputs the output result Cvi. The circuit simulator 25 performs the circuit-property analysis such as the DC analysis using the test-bench description data stored in the test-bench storage unit 34 based on the netlist Cn.

During an operation S118, it is determined whether or not the layout data LD is corrected based on the analysis in the operation S117. When the layout data LD is corrected (operation S118: Yes), the process returns to the operation S115. For example, the width of wiring coupled to the gate electrodes may be corrected. According to the netlist Bn generated by the circuit design, the variations in the mobility of the transistor may be decreased. Therefore, there may be no difference between the drain current or the gate voltage of the output result Cvi and that of the output result Bvi, which is caused by the STI stress. The process may not return to the circuit design, for example, the operation S101 to correct the gate-layout form of the transistor. When the correction is not performed operation S118: No), the design process may be finished.

When a plurality of gates is provided in the diffusion region, the design support apparatus sets the parameter SA and SB based on the layout form of the gates. Consequently, the mobility of a transistor including gate electrodes within the diffusion region may be estimated easily.

When the parameter SA or the parameter SB is smaller than the safety value, the design support apparatus determines the parameter SA or the parameter SB to be the safety value. Therefore, a netlist having the reduced variations in transistor mobility may be generated. There may be no difference between the drain current or the gate voltage obtained in the layout design and that obtained in the circuit design, which is caused by the STI stress. Further, the return from the layout design to the circuit design may be decreased.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

The invention claimed is:

1. A design support apparatus comprising:
a memory; and
a processor that executes a procedure in the memory, the procedure including:
a circuit-data generation process that generates circuit data based on layout information of a semiconductor integrated circuit; and
a parameter determination process that sets a first parameter relating to mechanical stress exerted on a transistor including at least one of a plurality of gates in a diffusion region,
wherein the circuit-data generation process obtains a mobility of the transistor based on the first parameter and reflects the mobility in the circuit data;
wherein the parameter determination process sets the first parameter based on one of,
an average value of distances from an end of the diffusion region to each of the at least one of the plurality of gates, and
map data including a distance between a gate closest to the end of the diffusion region and the end, a gate pitch between the at least one of the plurality of gates, and a number of the at least one of the plurality of gates.

2. The design support apparatus according to claim 1, wherein when the first parameter is smaller than a second parameter obtained when the mobility becomes saturated, the circuit-data generation process sets the second parameter as the first parameter.

3. A design support method of a semiconductor integrated circuit to be executed by a computer, the design support method comprising:
generating, using a processor, circuit data based on layout information of the semiconductor integrated circuit;
setting a first parameter relating to mechanical stress exerted on a transistor including at least one of a plurality of gates in a diffusion region;
obtaining mobility of the transistor based on the first parameter; and
reflecting the mobility in the circuit data;
wherein the setting sets the first parameter based on one of,
an average value of distances from an end of the diffusion region to each of the at least one of the plurality of gates, and
map data including a distance between a gate closest to the end of the diffusion region and the end, a gate pitch between the at least one of the plurality of gates, and a number of the at least one of the plurality of gates.

4. The design support method according to claim 3, wherein when the first parameter is smaller than a second parameter obtained when the mobility becomes saturated, the setting sets the second parameter as the first parameter.

5. A non-transitory computer-readable recording medium storing a program to be executed by a computer, the program comprising:
generating circuit data based on layout information of the semiconductor integrated circuit;
setting a first parameter relating to a mechanical stress exerted on a transistor including at least one of a plurality of gates in a diffusion region;
obtaining mobility of the transistor based on the first parameter; and
reflecting the mobility in the circuit data;
wherein the setting sets the first parameter based on one of,
an average value of distances from an end of the diffusion region to each of the at least one of the plurality of gates, and
map data including a distance between a gate closest to the end of the diffusion region and the end, a gate pitch between the at least one of the plurality of gates, and a number of the at least one of the plurality of gates.

6. The computer-readable recording medium according to claim 5, wherein when the first parameter is smaller than a second parameter obtained when the mobility becomes saturated, the setting sets the second parameter as the first parameter.

* * * * *